United States Patent
Yu et al.

(10) Patent No.: US 11,056,676 B2
(45) Date of Patent: Jul. 6, 2021

(54) METHOD OF BRIGHTNESS ENHANCEMENT LAYER WITH SUB-WAVELENGTH STRUCTURE FOR A LIGHT-EMITTING ELEMENT

(71) Applicant: NATIONAL FORMOSA UNIVERSITY, Huwei Township (TW)

(72) Inventors: Hsin-Her Yu, Huwei Township (TW); Wen-Kai Kuo, Huwei Township (TW); Chih-Kai Nien, Huwei Township (TW)

(73) Assignee: NATIONAL FORMOSA UNIVERSITY, Yunlin County (TW)

( * ) Notice: Subject to any disclaimer, the term of this patent is extended or adjusted under 35 U.S.C. 154(b) by 0 days.

(21) Appl. No.: 15/871,001

(22) Filed: Jan. 14, 2018

(65) Prior Publication Data

US 2020/0303682 A1    Sep. 24, 2020

(51) Int. Cl.
*H01L 51/52* (2006.01)
*H01L 51/56* (2006.01)
*H01L 33/50* (2010.01)

(52) U.S. Cl.
CPC ........ *H01L 51/5262* (2013.01); *H01L 33/502* (2013.01); *H01L 51/56* (2013.01)

(58) Field of Classification Search
CPC ............................ H01L 51/5262; H01L 51/56
See application file for complete search history.

(56) References Cited

U.S. PATENT DOCUMENTS

2016/0351847 A1* 12/2016 Wu ..................... H01L 51/5225
2018/0237294 A1*  8/2018 Giordano ........... G01N 27/4146

FOREIGN PATENT DOCUMENTS

| TW | I452231 | 6/2010 |
| TW | I511344 | 5/2013 |
| TW | M477052 | 9/2013 |
| TW | I544237 | 8/2016 |

* cited by examiner

*Primary Examiner* — Austin Murata (57) ABSTRACT

A method of brightness enhancement layer with sub-wavelength structure for a light-emitting element contains steps of: (a). synthesizing PS nanospheres by using emulsion polymerization without emulsifier; (b). spreading and suspending the PS nanospheres in a liquid level by way of PS nanosphere suspension; (c). forming the PS nanospheres in a close-packed arrangement by using surfactant solution; (d). regulating a diameter of the PS nanospheres in an oxygen plasma treatment so as to form non-close-packed single-layer PS nanosphere array structure, thus producing the sub-wavelength structure; (e) replicating the sub-wavelength structure onto an indium tin oxide (ITO) conductive glass in a nanoimprint lithography manner; and (f) using the ITO conductive glass with the sub-wavelength structure as a substrate so as to manufacture the light-emitting element.

10 Claims, 11 Drawing Sheets

METHOD OF BRIGHTNESS ENHANCEMENT LAYER WITH SUB-WAVELENGTH STRUCTURE FOR A LIGHT-EMITTING ELEMENT

FIELD OF THE INVENTION

The present invention relates to a method of manufacturing a light-emitting element, and more particularly to a method of a brightness enhancement layer with a sub-wavelength structure for the light-emitting element.

BACKGROUND OF THE INVENTION

Conventional light-emitting diodes have been developed widely, for example, a total reflection angle of a substrate is enhanced in a microlens array manner or a surface roughening manner. TW Publication No. 1544237 disclosed a composite optical film having a microlens array is packed and is pressed so as to produce regular patterns of various lens sizes. But the lenses flush with one another in a microlens array or a columnar lenticular array, and a cross section of the lens is circular or is polygonal so as to enhance 8% of brightness more than a conventional diffuser film.

TW Publication No. 1511344 disclosed a light diffusion layer is made of raspberry-shaped particles and resin so as to form a difference between refractive indexes of raspberry-shaped particles and resin. Furthermore, each raspberry-shaped particle has multiple bosses so as to enhance light scattering and light emitting efficiency of organic light-emitting diode (OLED) and to reduce color cast of OLED.

A conventional illumination device having a brightness enhancement film of micro structure is disclosed in TW Publication No. 1452231. The brightness enhancement film has a serrated Fresnel lens mating with reflection element so as to focus lights, to enhance luminous efficacy and light intensity, and to lower a number of OLDEs.

A conventional condensed microstructure array and reflection layer is disclosed in TW Publication No. M477052 and is employed to guide lights from OLEDs to a specific direction so as to enhance brightness in a desired area and to avoid total reflection at large incidence angle, thus increasing luminous efficacy.

However, the luminous efficacy of the OLEDs is enhanced by increasing the total reflection angle in a microlens array manner or a surface roughening manner, thus causing atomization of the substrate and reducing image sharpness.

The present invention has arisen to mitigate and/or obviate the afore-described disadvantages.

SUMMARY OF THE INVENTION

The primary aspect of the present invention is to provide a method of a brightness enhancement layer with a sub-wavelength structure for the light-emitting element which enhances luminous efficacy of organic light-emitting diode (OLED).

Another aspect of the present invention is to provide a method of a brightness enhancement layer with a sub-wavelength structure for the light-emitting element which is applied to illumination field, a flat panel display, solar batteries, and optical elements.

To obtain above-mentioned aspects, a method of a brightness enhancement layer with a sub-wavelength structure for a light-emitting element provided by the present invention contains: steps of:

(a). synthesizing PS nanospheres by using emulsion polymerization without emulsifier;

(b). spreading and suspending the PS nanospheres in a liquid level by way of PS nanosphere suspension;

(c). forming the PS nanospheres in a close-packed arrangement by using surfactant solution;

(d). regulating a diameter of the PS nanospheres in an oxygen plasma treatment so as to form non-close-packed single-layer PS nanosphere array structure, thus producing the sub-wavelength structure;

(e) replicating the sub-wavelength structure onto an indium tin oxide (ITO) conductive glass in a nanoimprint lithography manner; and (f) using the ITO conductive glass with the sub-wavelength structure as a substrate so as to manufacture the light-emitting element.

Preferably, in the step of (b), a concentration of the PS nanosphere suspension is within 0.1 wt %-0.5 wt %.

Preferably, in the step of (c), the surfactant solution is any one of sodium dodecyl sulfate (SDS), linear alkylbenzene sulfonate (LAS), salcohol ether sulphate (AES), fatty alcoholpolyoxyethylene ether ammonium sulfate (AESA), polyoxyethylene nonylphenyl ether (TX-10), and a mixture of at least two of LAS, AES, AESA, and TX-10

Preferably, a concentration of the surfactant solution is within 0.5 wt % to 3 wt %.

Preferably, in the step of (f), a periodic range of the sub-wavelength structure is within 200 nm to 500 nm Preferably, in the step of (f), the sub-wavelength structure is arranged in any one of a parabola array, a bomb array, and a cone array.

Preferably, in the step of (f), the substrate is made of thermoplastic polymer, and the thermoplastic polymer is any one of polyethylene (PE), polypropylene (PP), polystyrene (PS), polymethylmethacrylate (PMMA), polyvinyl chloride (PVC), nylon, polycarbonate (PC), polyurethane (PU), polytetrafluoroethylene (Teflon, PTFE), cyclo olefin copolymer (COC), and a mixture of at least two of PE, PP, PS, PMMA, PVC, nylon, PC, PU, PTFE, and COC.

Preferably, in the step of (f), the sub-wavelength structure is made of any one of light curing agent NOA 63, polydimethylsiloxane (PDMS), diethylene glycol bis (allyl carbonate, CR-39), unsaturated polyester, epoxy, phenolic, and a mixture of at least two of PE, PP, PS, PMMA, PVC, nylon, PC, PU, PTFE, and COC.

Preferably, in the step of (f), the sub-wavelength structure of the brightness enhancement layer is applied to any one of organic light-emitting diode (OLED), light-emitting diode (LED), and a solar panel.

Preferably, in the step of (f), the sub-wavelength structure of the brightness enhancement layer is applied to a flat panel display of any one of a mobile device, an automotive navigation system, and a desktop computer, wherein the mobile device is any one of a smart watch, a virtual reality (VR), a smart phone, a tablet PC, a notebook computer.

DETAILED DESCRIPTION OF THE PREFERRED EMBODIMENTS

A method of brightness enhancement layer with sub-wavelength structure for a light-emitting element according to a preferred embodiment of the present invention comprises steps of: synthesizing polystyrene (PS) nanospheres by using emulsion polymerization without emulsifier; arranging the PS nanospheres in a close-packed PS monolayer array in a self-assembly manner;

etching the PS nanospheres to a predetermined diameter by way of oxygen plasma so as to produce sub-wavelength structure mold; imprinting sub-wavelength structure patterns onto an indium tin oxide (ITO) conductive glass in a nanoimprint lithography manner so as to produce a substrate; manufacturing the light-emitting element in a spin coating manner and a thermal evaporation manner so as to finish the light-emitting element with the brightness enhancement layer (BEL).

Accordingly, the method of the brightness enhancement layer with sub-wavelength structure comprises the steps of:

(a). synthesizing the PS nanospheres by using the emulsion polymerization without the emulsifier;

(b). spreading and suspending the PS nanospheres in a liquid level by way of PS nanosphere suspension;

(c). forming the PS nanospheres in a close-packed arrangement by using surfactant solution;

(d). regulating the diameter of the PS nanospheres in an oxygen plasma treatment so as to form non-close-packed single-layer PS nanosphere array structure, thus producing the sub-wavelength structure;

(e) replicating the sub-wavelength structure onto the ITO conductive glass in the nanoimprint lithography manner; and (f) using the ITO conductive glass with the sub-wavelength structure as the substrate so as to manufacture the light-emitting element.

In the steps (a) to (f), preparing a two-dimensional close-packed array mold, a two-dimensional non-close-packed array mold, the brightness enhancement layer, and the light-emitting element with the brightness enhancement layer are required.

Figure 1:
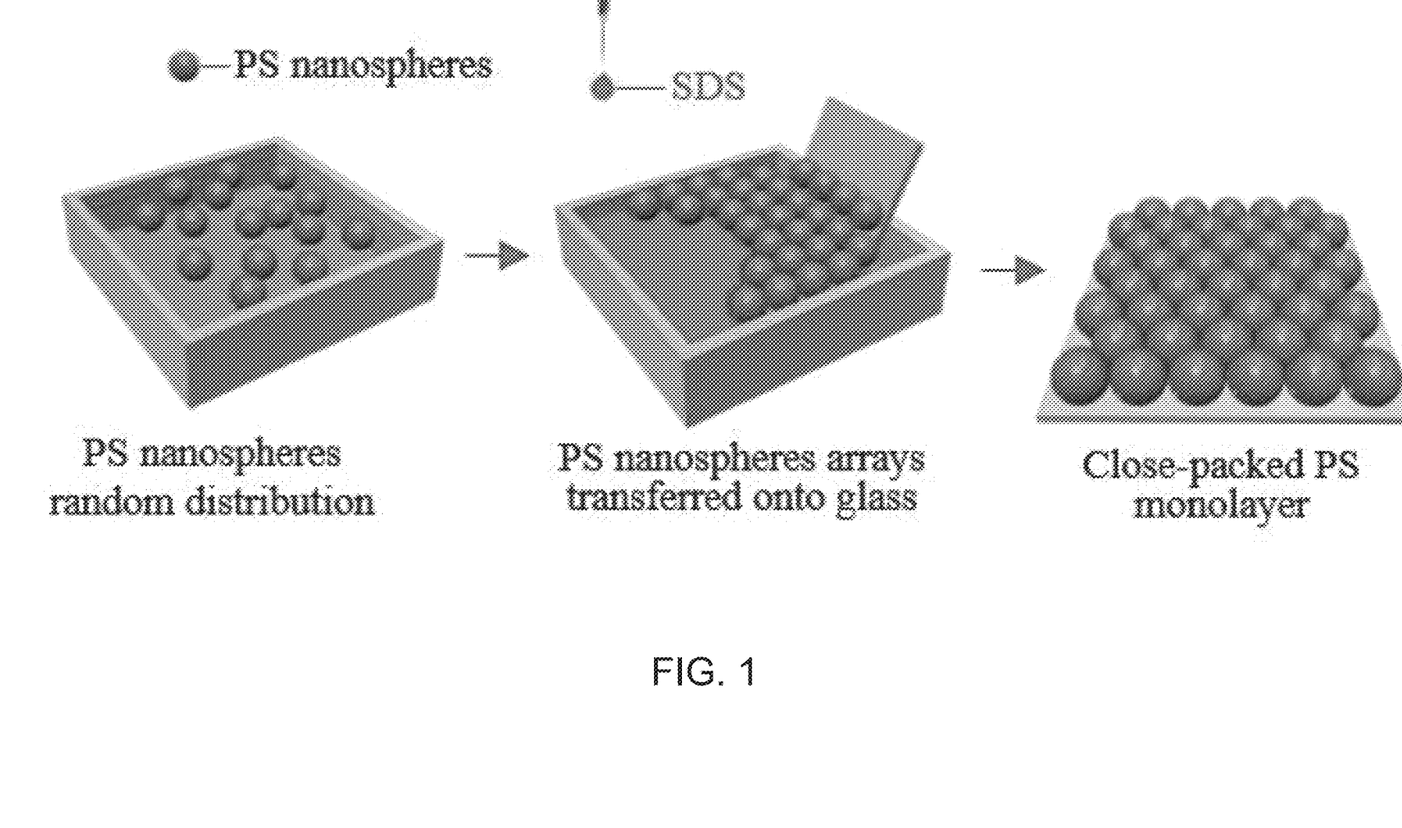
FIG. 1 is a schematic view showing a two-dimensional close-packed array mold being prepared according to a preferred embodiment of the present invention.

As shown in FIG. 1, to prepare the two-dimensional close-packed array mold, the PS nanospheres are synthesized by using the emulsion polymerization without the emulsifier, wherein aqueous ethanol is used as dispersant, and a weight percent concentration of the aqueous ethanol is 50%. Thereafter, the substrate (i.e., the ITO conductive glass with the sub-wavelength structure) is soaked in sodium hydroxide solution of 0.25 molarity (M) of 50 ml for 1 hour so as to modify its hydrophilic, and the substrate is washed by deionized water of 50 ml, then the deionized water is poured into a glass Petri dish and the substrate is obliquely placed on a peripheral side of the glass Petri dish (as shown in FIG. 1). Furthermore, the PS nanosphere suspension is dripped into the glass Petri dish by way of a microsyringe so that the PS nanospheres evenly spread on a surface between gas and liquid evenly. A concentration of the PS nanosphere suspension is within 0.1 wt %-0.5 wt %, wherein the concentration of the PS nanosphere suspension is 0.25 wt %. Surfactant solution (such as sodium dodecyl sulfate (SDS), i.e., L12) is dripped into the glass Petri dish further so as to increase a surface tension of the deionized water, hence the PS nanospheres form a close-packed PS monolayer and move on the substrate, as shown in FIG. 1. Preferably, the surfactant solution is any one of linear alkylbenzene sulfonate (LAS), salcohol ether sulphate (AES), fatty alcoholpolyoxyethylene ether ammonium sulfate (AESA), polyoxyethylene nonylphenyl ether (TX-10), and a mixture of at least two of LAS, AES, AESA, and TX-10, and a concentration of the surfactant solution is within 0.5 wt % to 3 wt %, wherein the surfactant solution is sodium dodecyl sulfate (SDS), and a centration of the SDS is 2 wt %.

Figure 2:
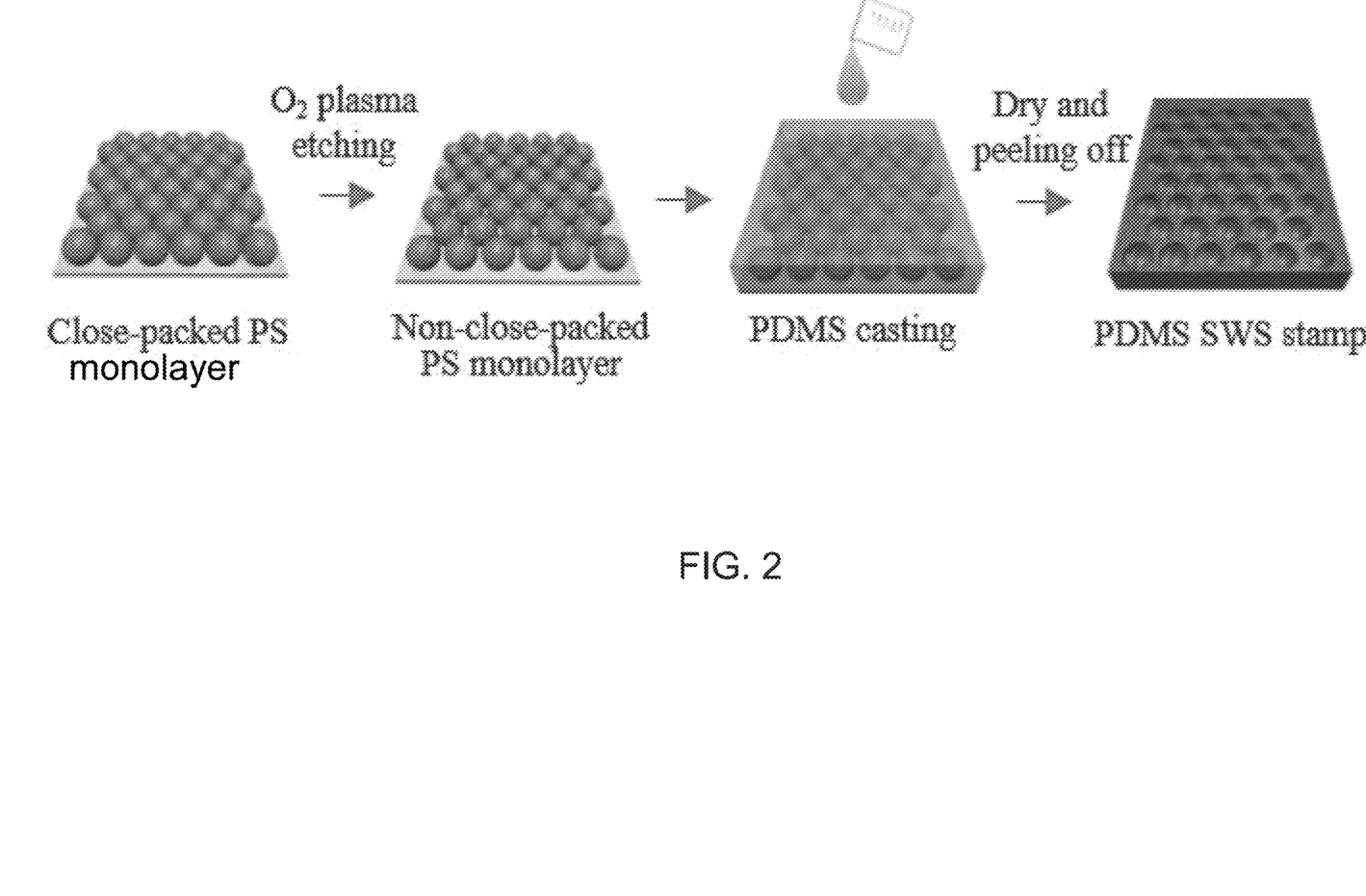
FIG. 2 is a schematic view showing a two-dimensional non-close-packed array mold being prepared according to the preferred embodiment of the present invention.

As shown in FIG. 2, to prepare the two-dimensional non-close-packed array mold, the polystyrene nanospheres in the two-dimensional close-packed array mold are etched in the oxygen plasma treatment of 0.7 sccm oxygen flow at 100 W so as to reduce the diameter of the polystyrene nanospheres, thus forming the non-close-packed PS monolayer.

Referring to FIG. 2, to prepare the brightness enhancement layer, base of polydimethylsiloxane (PDMS), curing agent, and silicone oil are mixed at a mass ratio of 10:1:1, are vacuumed so as to eliminate bubbles, and are casted on the two-dimensional non-close-packed array mold. Thereafter, the two-dimensional non-close-packed array mold are dried in a baker at a temperature of 60° C. so as to solidify and to peel the polystyrene nanospheres off from the two-dimensional non-close-packed array mold, thus producing a PDMS stamp on which multiple orifices form, as illustrated in FIG. 2.

Figure 3:
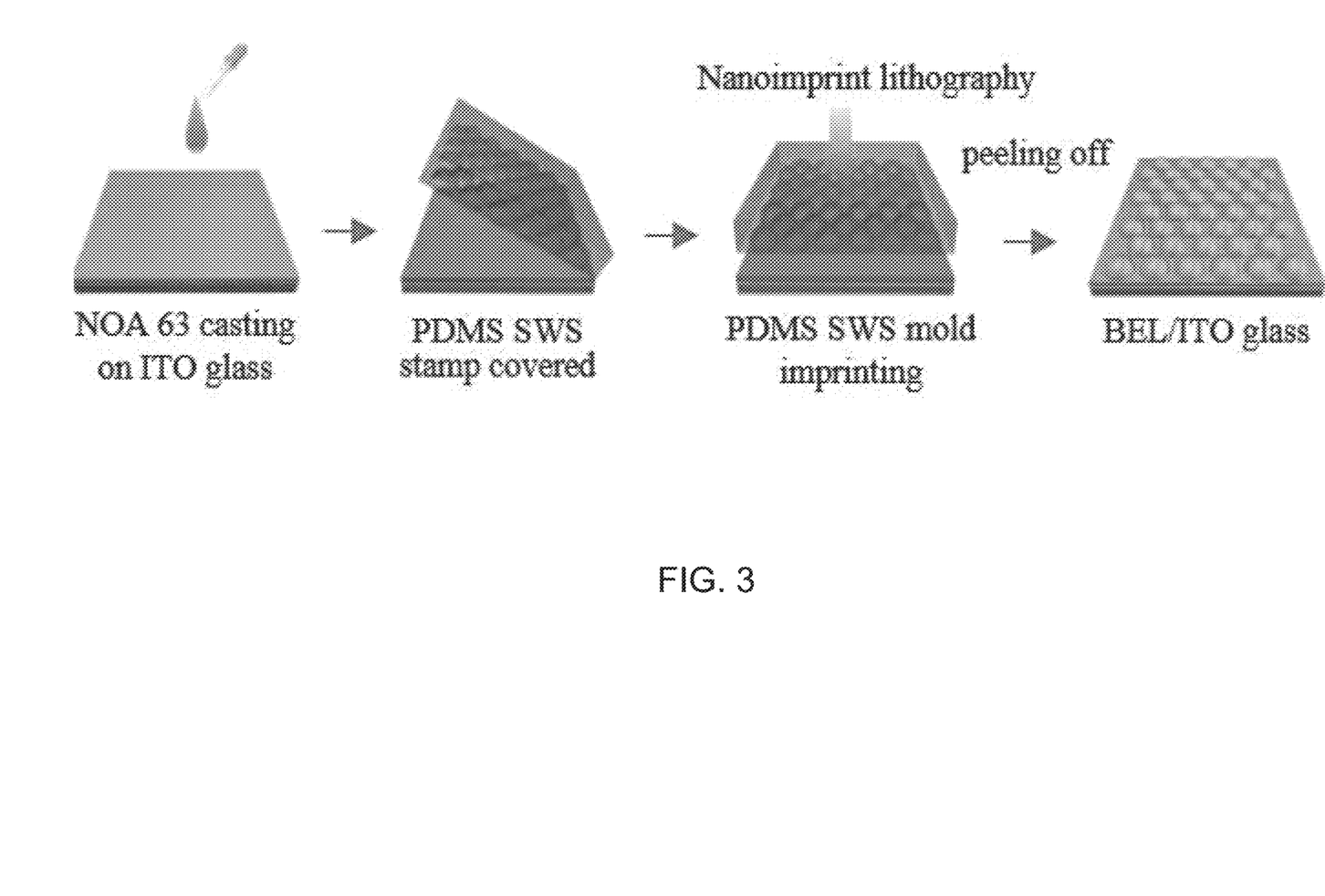
FIG. 3 is a schematic view showing a brightness enhancement layer with a sub-wavelength structure being prepared according to the preferred embodiment of the present invention.

With reference to FIG. 3, to prepare the brightness enhancement layer, UV curable optical adhesive (such as light curing agent NOA 63) is casted to multiple orifices of the PDMS stamp, and the PDMS stamp is covered on the ITO conductive glass and imprints the ITO conductive glass at a pressure of 2 kg/cm$^2$ in the nanoimprint lithography (NIL) manner, and the PDMS stamp and the ITO conductive glass are irradiated by UV lights for 10 minutes so as to solidify the UV curable optical adhesive. Thereafter, the PDMS stamp are peeled off from the ITO conductive glass so as to obtain ITO conductive glass having brightness enhancement layer on which sub-wavelength structure (SWS) is formed.

To prepare the light-emitting element (such as organic light-emitting diode (OLED)), the ITO conductive glass is used as the substrate, wherein conductive polymer material (such as PEDOT:PSS) is coated on the ITO conductive glass in the spin coating manner so as to use as hole transport layer (HTL), wherein 26DCZppy (molecular formula is C41H27N3) is mixed with organic light-emitting material (such as Firpic), and 2,2', 2"-(1,3,5-Benzinetriyl)-tris(1-phenyl-1-H-benzimidazole) (TBPi) is deposited in the thermal evaporation manner so as to produce an electron transport layer. Thereafter, lithium fluoride (LiF) is evaporated so as to form a buffer layer, and cathode of OLED is made of aluminum (AL), wherein a structure of the light-emitting element is ITO (400 nm)/PEDOT:PSS (55 nm)/26DCzppy: Flrpic:Ey53 (B:15%; Y:X %(40 nm)/TBPi (35 nm)/LiF (0.8 nm)/Al (150 nm).

Figure 4:
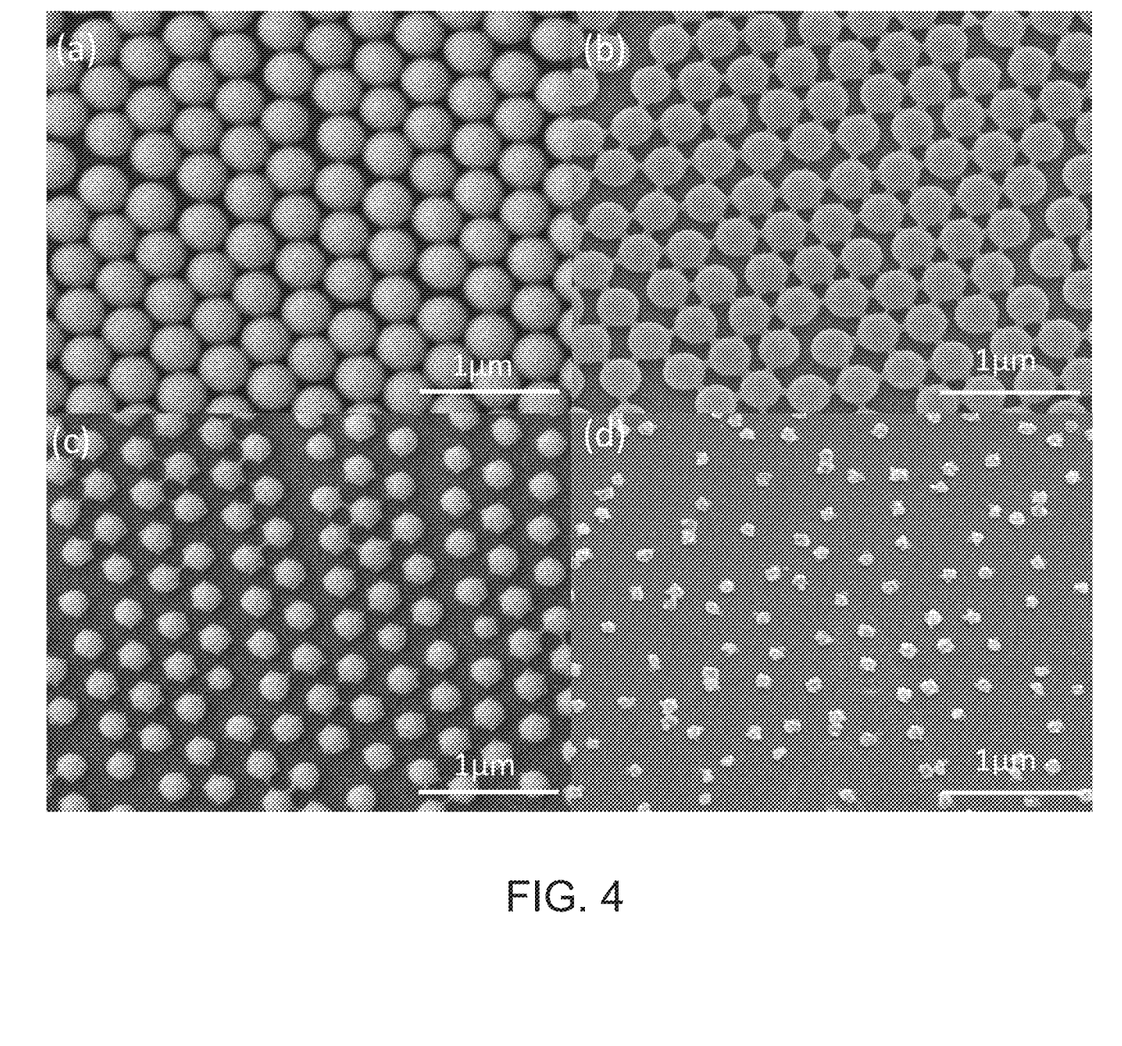
FIG. 4 shown a diameter of polystyrene nanospheres is regulated in an oxygen plasma treatment in different times according to the preferred embodiment of the present invention.

In the oxygen plasma treatment, a change of the diameter of the polystyrene nanospheres is observed by using a scanning electron microscope (SEM). For example, the diameter of the polystyrene nanospheres is 300 nm prior to the oxygen plasma treatment, as shown in portion (a) of FIG. 4. Portion (b) of FIG. 4 illustrates the diameter of the polystyrene nanospheres is 270 nm after 2 minute in the oxygen plasma treatment. Portion (c) of FIG. 4 illustrates the diameter of the polystyrene nanospheres is 235 nm after 4 minute in the oxygen plasma treatment. Portion (d) of FIG. 4 illustrates the diameter of the polystyrene nanospheres is 183 nm after 6 minute in the oxygen plasma treatment. Referring to portion (b) of FIG. 4, when etching the PS nanospheres in a short time, the PS nanospheres connect together. However, when etching the PS nanospheres in a long time, the diameter of the PS nanospheres decreases, and a shape of the PS nanospheres is irregular, as shown in portion (d) of FIG. 4.

Figure 5:
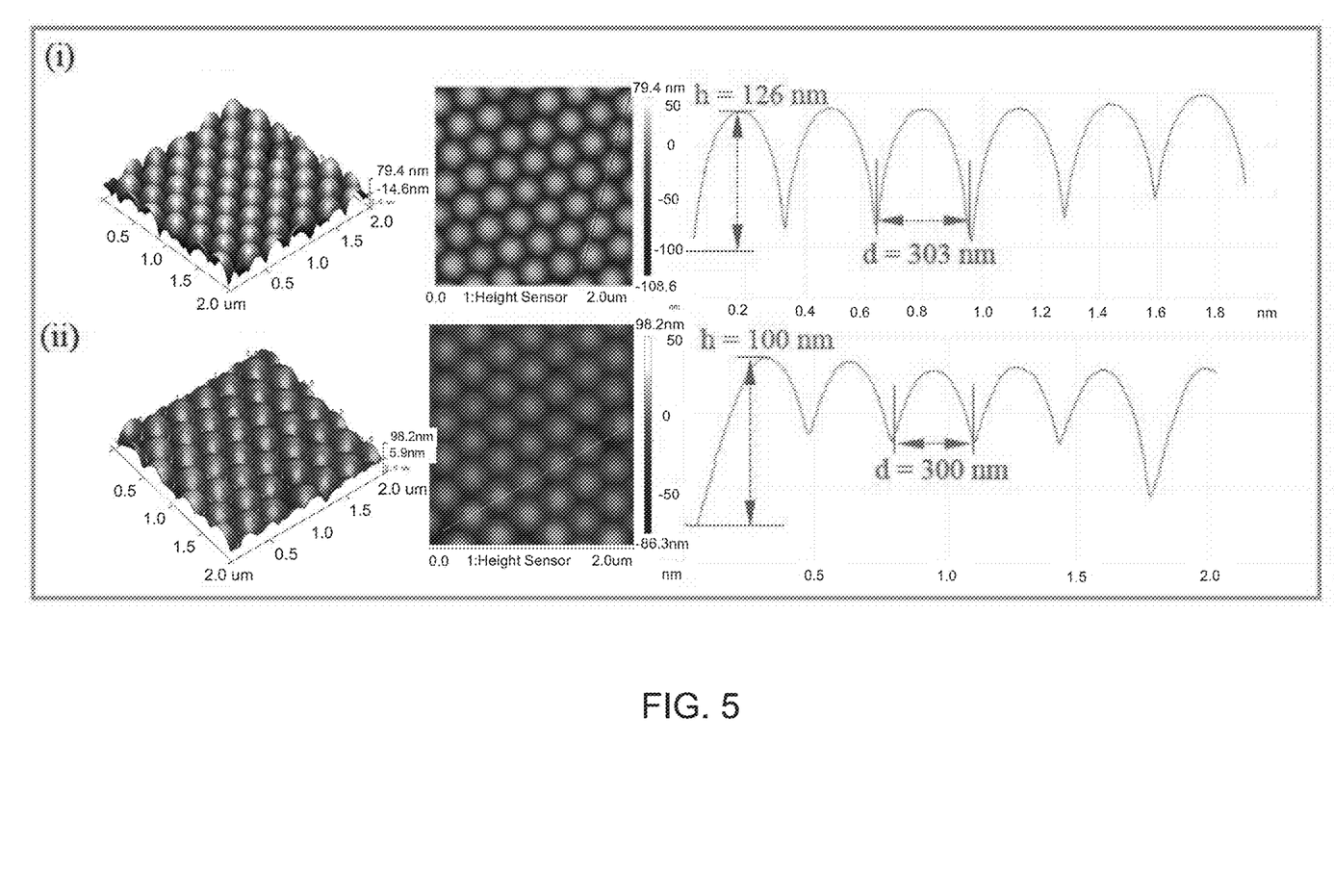
FIG. 5 shows a width and a depth of the close-packed PS monolayer before oxygen plasma treatment according to the preferred embodiment of the present invention.

A change of depth and width of the PS monolayer array is observed before/after the oxygen plasma treatment and after turning the PDMS stamp by way of an atomic force microscope (AFM). Portion (i) of FIG. 5 illustrates a width (d) and a depth (h) of the close-packed PS monolayer before oxygen plasma treatment, wherein the width (d) is 297 nm, and the depth (h) is 292 nm. Portion (ii) of FIG. 5 illustrates the ITO conductive glass is imprinted so as to form a convex array film by using the UV curable optical adhesive (such as NOA 63) of portion (i) of FIG. 5, wherein a width (d) of the convex array film is 300 nm, and a depth (d) of the convex array film is 100 nm.

Figure 6:
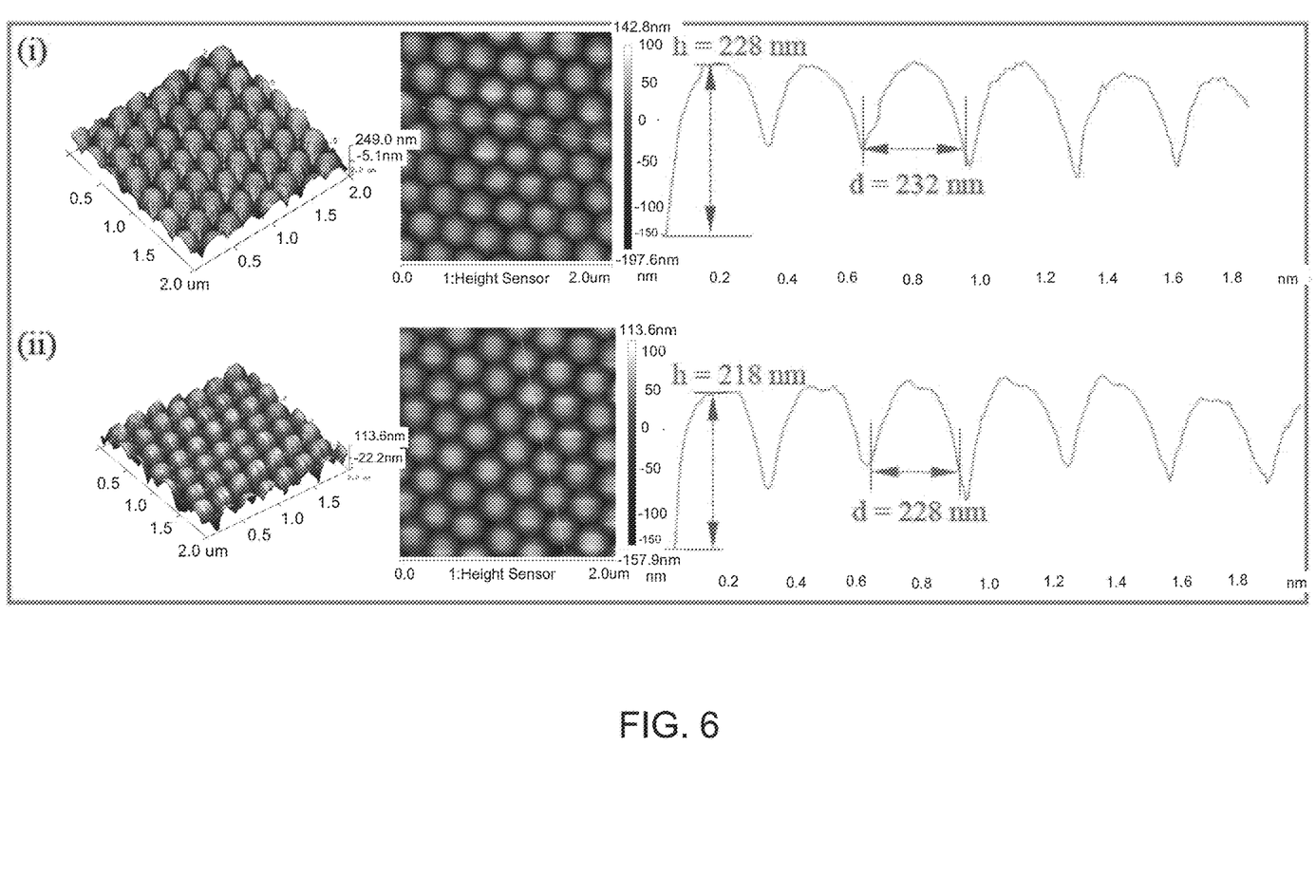
FIG. 6 shows a width and a depth of a close-packed PS monolayer array mold after 4 minutes in the oxygen plasma treatment according to the preferred embodiment of the present invention.

Portion (i) of FIG. 6 illustrates a width and a depth of a close-packed PS monolayer array mold after 4 minutes in the oxygen plasma treatment, wherein a width of the non-close-packed array mold is 232 nm, and a depth of the non-close-packed array mold is 228 nm. Portion (ii) of FIG. 6 illustrates the brightness enhancement layer is imprinted by using the UV curable optical adhesive (such as NOA 63) of portion (i) of FIG. 6, wherein a width of the brightness enhancement layer is 228 nm, and a depth of the brightness enhancement layer is 218 nm. After the polystyrene nanospheres are etched after 4 minutes in the oxygen plasma treatment, the diameter of the polystyrene nanospheres is decreased so as to increase distances among the polystyrene nanospheres, hence the PDMS penetrates into slits in the PS monolayer array so as to produce the sub-wavelength structure of a large width (d) and a large depth (h), and the sub-wavelength structure patterns are imprinted onto the ITO conductive glass.

Figure 7:
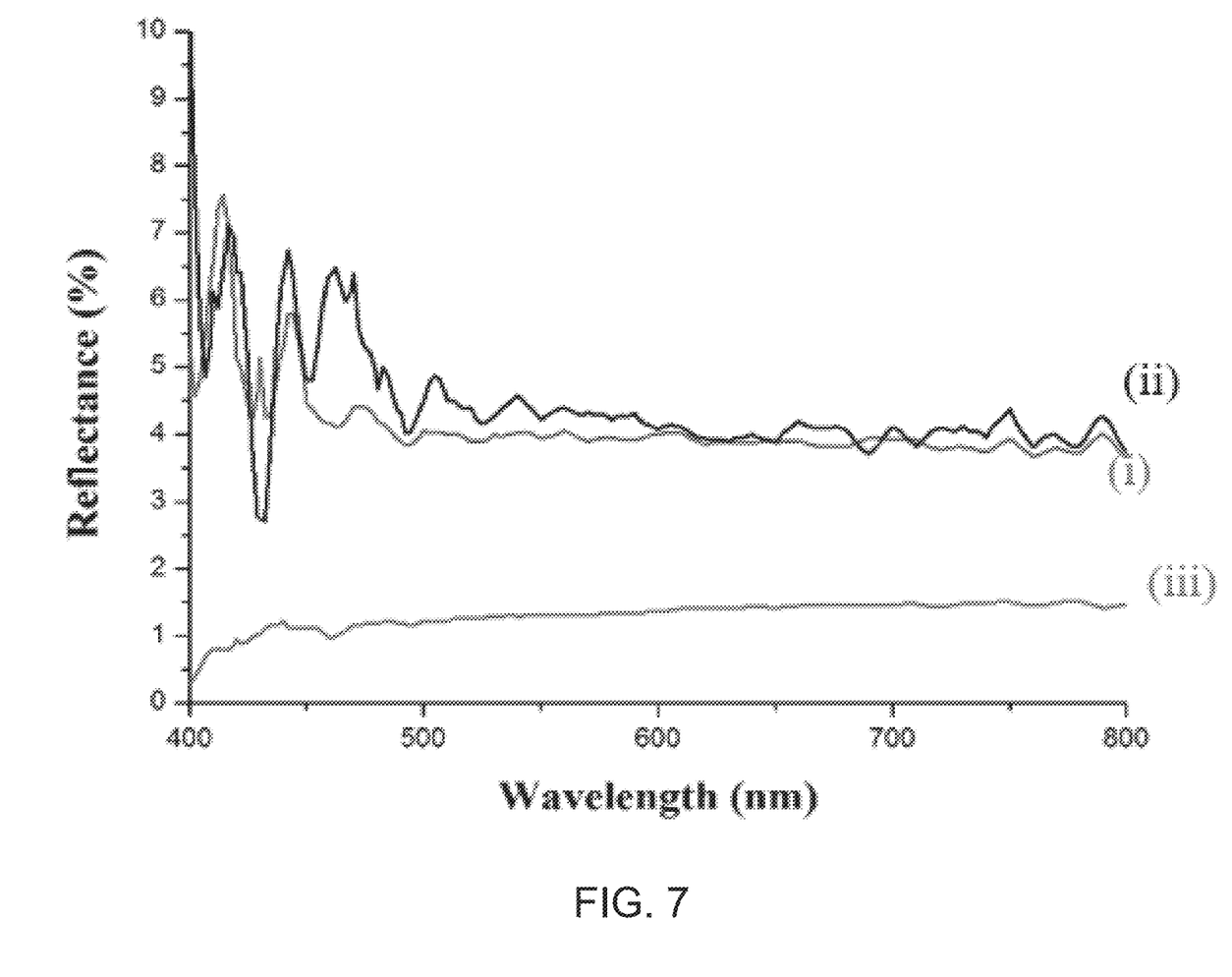
FIG. 7 shows a reflectivity of a ITO conductive glass after a spectral analysis according to the preferred embodiment of the present invention.

FIG. 7 shows a reflectivity of the ITO conductive glass after a spectral analysis, wherein the reflectivity of the ITO conductive glass is 1.4% (as shown in lines (i) to (iii) of FIG. 7) less than a reflectivity (4.2%) of a bare glass and a reflectivity (4.6%) of NOA 63.

Figure 8:
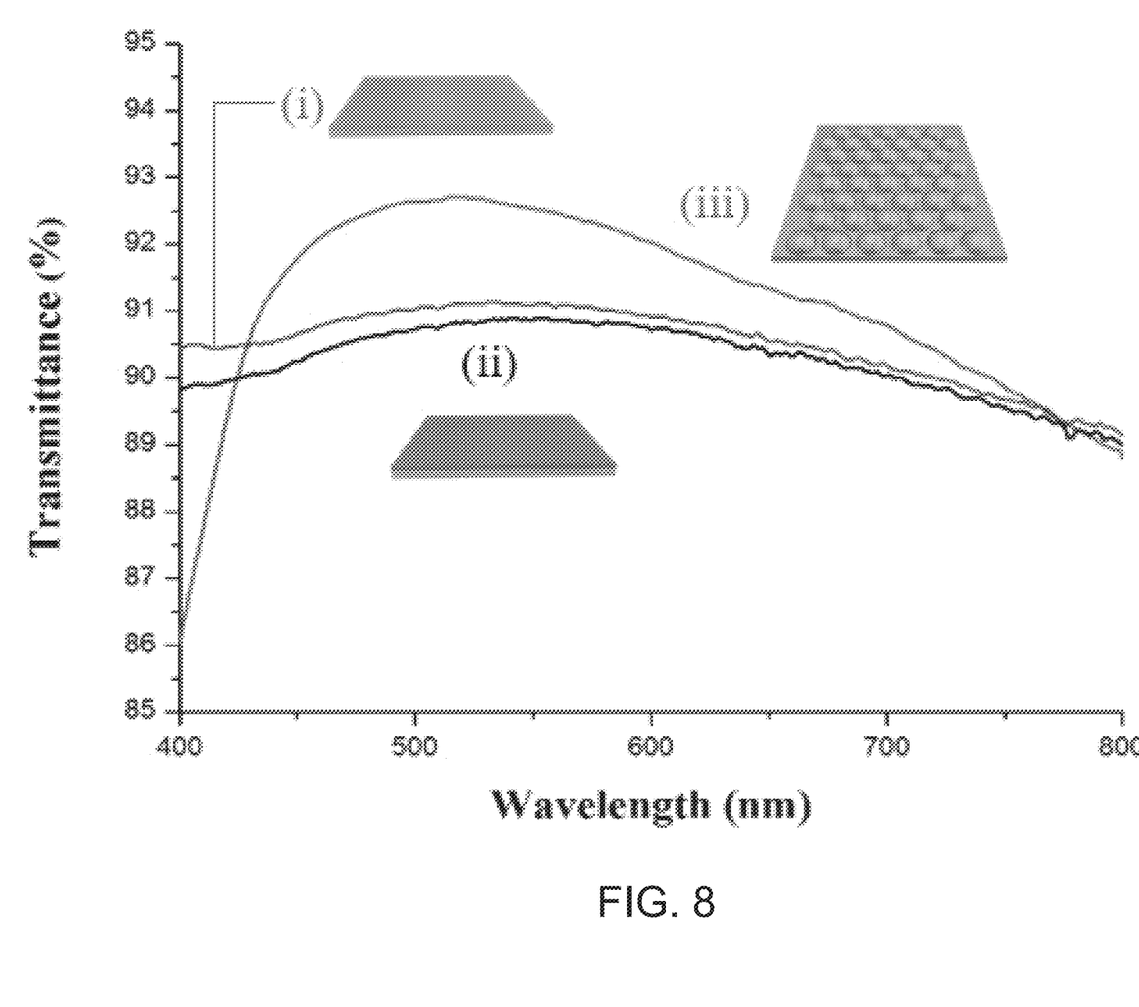
FIG. 8 shows a light transmittance of the ITO conductive glass after the spectral analysis according to the preferred embodiment of the present invention.

FIG. 8 shows a light transmittance of the ITO conductive glass after a spectral analysis, wherein lines (i) and (ii) of FIG. 8 show light transmittances of the bare glass and NOA 63 are 90.5% and 90.2% respectively. The light transmittance of the ITO conductive glass is 91.6% within a wavelength of 450 nm to 800 nm as shown in line (iii) of FIG. 7, hence the brightness enhancement layer increases the light transmittance of the bare glass. After coating NOA 63 on the bare glass, the light transmittance of the bare glass reduces as shown in lines (ii) and (iii) of FIG. 8. Thereby, the sub-wavelength structure of the brightness enhancement layer lowers difference of refractive indexes between air and glass.

Figure 9:
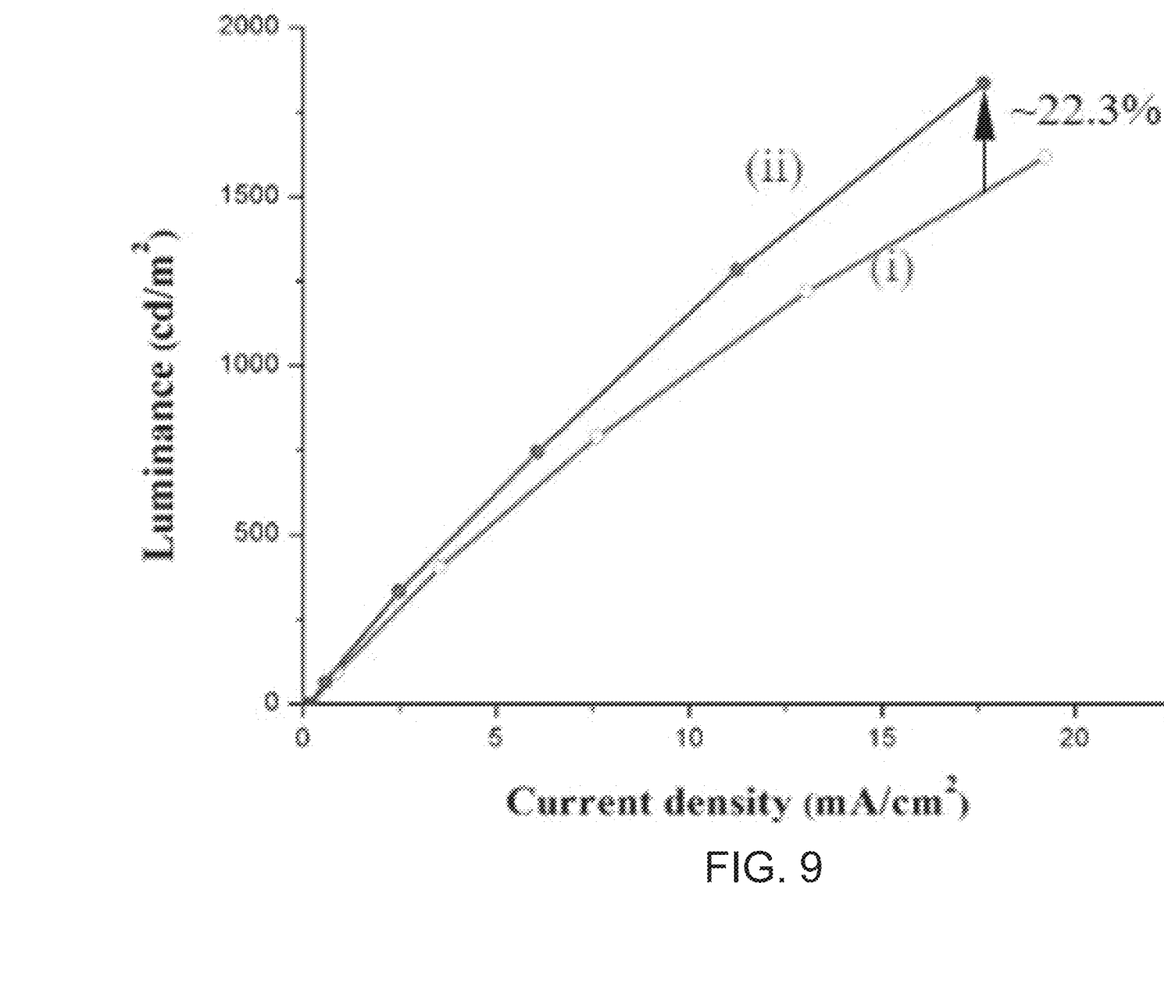
FIG. 9 shows a light intensity of OLED according to the preferred embodiment of the present invention.
Figure 10:
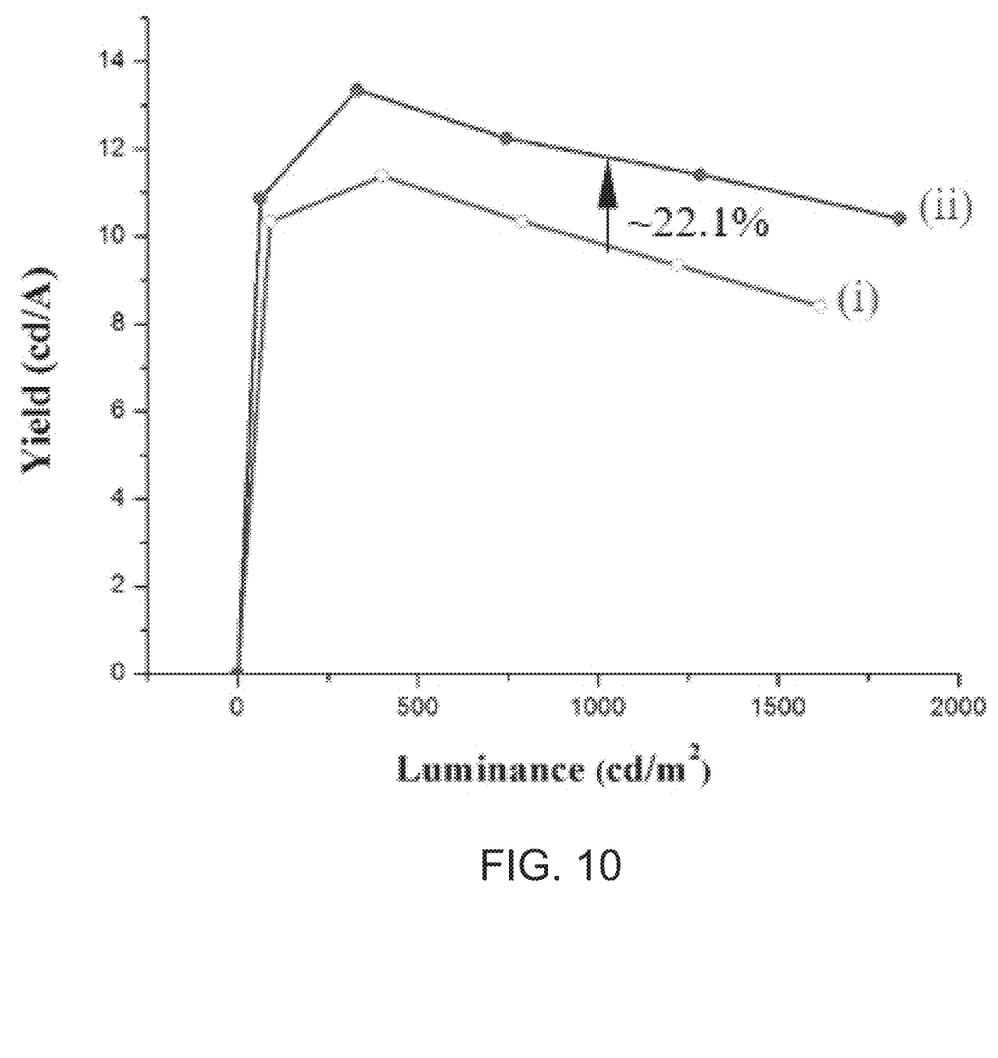
FIG. 10 shows a luminous efficacy of the OLED according to the preferred embodiment of the present invention.
Figure 11:
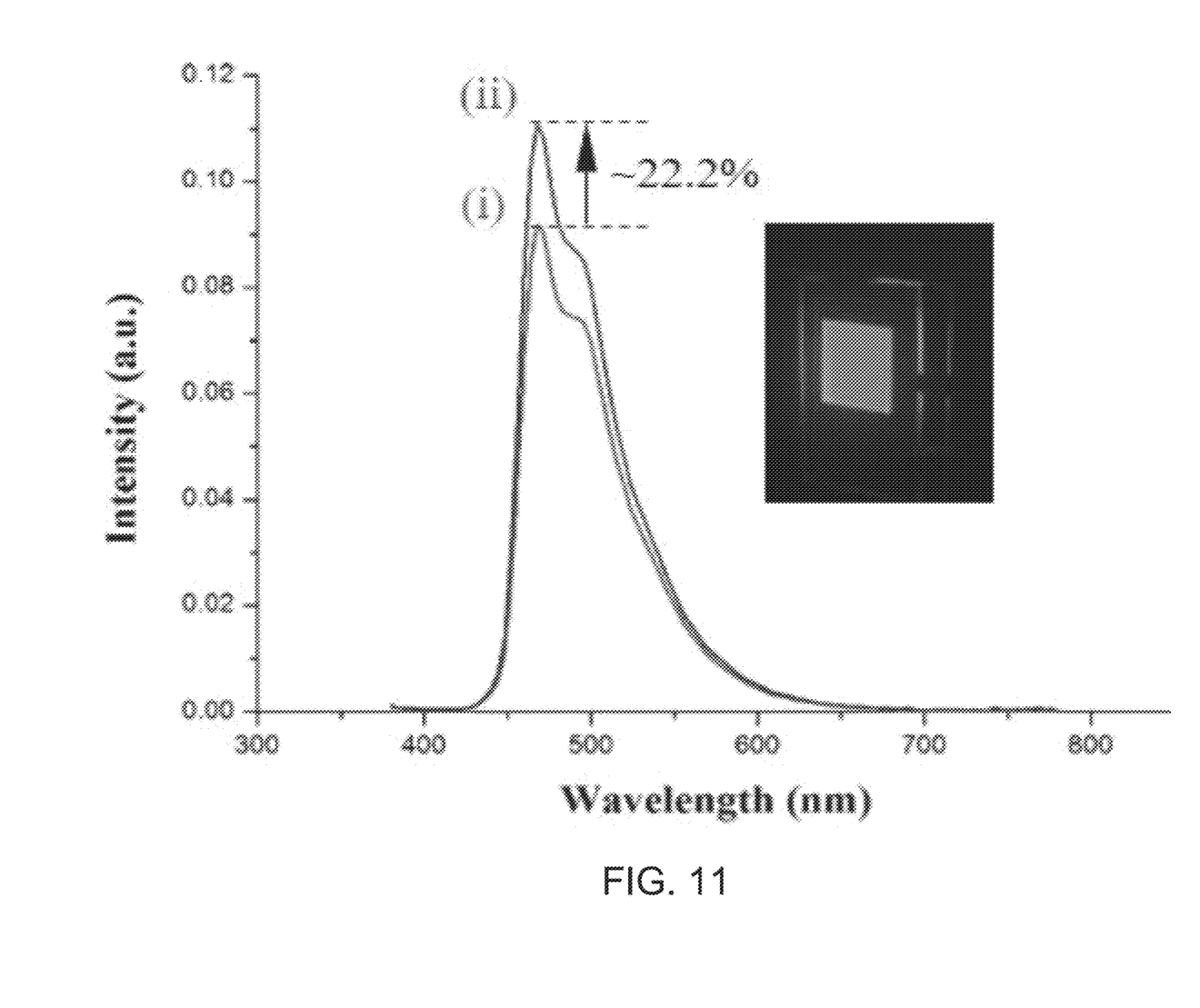
FIG. 11 shows a light transmittance of the OLED according to the preferred embodiment of the present invention.

FIG. 9 shows a light intensity of the OLED according to the preferred embodiment of the present invention. FIG. 10 shows a luminous efficacy of the OLED according to the preferred embodiment of the present invention. FIG. 11 shows a light transmittance of the OLED according to the preferred embodiment of the present invention. With reference to portion (ii) of FIG. 9, a luminous efficacy of the OLED with the brightness enhancement layer is 22.3% more than that of the OLED without the brightness enhancement layer in the same current density. Referring to lines (ii) and (i) of FIG. 10, a current efficiency of the OLED with the brightness enhancement layer is 22.1% more than that of the OLED without the brightness enhancement layer in the same luminous efficacy. Referring to lines (ii) and (i) of FIG. 11, a luminous efficacy of the OLED with the brightness enhancement layer is 22.2% more than that of the OLED without the brightness enhancement layer when the luminous wavelength is 475 nm, it is because that the sub-wavelength structure of the brightness enhancement layer lowers the difference of the refractive indexes between air and glass so as to enhance the light transmittance.

In the step of (f), a periodic range of the sub-wavelength structure is within 200 nm to 500 nm, and the sub-wavelength structure is arranged in any one of a parabola array, a bomb array, and a cone array. Preferably, the substrate is made of thermoplastic polymer, and the thermoplastic polymer is any one of polyethylene (PE), polypropylene (PP), polystyrene (PS), polymethylmethacrylate (PMMA), polyvinyl chloride (PVC), nylon, polycarbonate (PC), polyurethane (PU), polytetrafluoroethylene (Teflon, PTFE), cyclo olefin copolymer (COC), and a mixture of at least two of PE, PP, PS, PMMA, PVC, nylon, PC, PU, PTFE, and COC. Preferably, the UV curable optical adhesive is replaced by any one of polydimethylsiloxane (PDMS), diethylene glycol bis (allyl carbonate, CR-39), unsaturated polyester, epoxy, phenolic, and a mixture of at least two of PE, PP, PS, PMMA, PVC, nylon, PC, PU, PTFE, and COC.

Preferably, the sub-wavelength structure of the brightness enhancement layer is applied to light-emitting diode (LED), a solar panel, or a flat panel display of any one of a mobile device (such as a smart watch, a virtual reality (VR), a smart phone, a tablet PC, a notebook computer), an automotive navigation system, and a desktop computer.

In the step of (d), the polystyrene nanospheres are etched in different times so as to regulate the diameter of the PS nanospheres, thus applying the polystyrene nanospheres to illuminations in various fields, such as agriculture, fishing industry, and animal husbandry.

Thereby, the method of the present invention reduces fabrication cost, simplifies manufacture process, and enhances luminous efficacy and light transmittance. Preferably, the method of the present invention is employed to solar batteries and optical elements.

While the preferred embodiments of the invention have been set forth for the purpose of disclosure, modifications of the disclosed embodiments of the invention and other embodiments thereof may occur to those skilled in the art. Accordingly, the appended claims are intended to cover all embodiments which do not depart from the spirit and scope of the invention.

What is claimed is:

1. A method of brightness enhancement layer with sub-wavelength structure for a light-emitting element comprising steps of:
   (a) synthesizing polystyrene (PS) nanospheres by using emulsion polymerization without an emulsifier;
   (b) spreading and suspending the PS nanospheres in a liquid level by way of PS nanosphere suspension;
   (c) forming the PS nanospheres in a close-packed arrangement by using a surfactant solution;
   (d) regulating a diameter of the PS nanospheres in an oxygen plasma treatment so as to form a non-close-packed single-layer PS nanosphere array structure, thus producing the sub-wavelength structure;
   (e) replicating the sub-wavelength structure onto an indium tin oxide (ITO) conductive glass in a nanoimprint lithography manner; and
   (f) using the ITO conductive glass with the sub-wavelength structure as a substrate so as to manufacture the light-emitting element.

2. The method as claimed in claim 1, wherein in step (b), a concentration of the PS nanosphere suspension is within 0.1 wt %-0.5 wt %.

3. The method as claimed in claim 1, wherein in step (c), the surfactant solution comprises any one of sodium dodecyl sulfate (SDS), linear alkylbenzene sulfonate (LAS), alcohol ether sulphate (AES), fatty alcoholpolyoxyethylene ether ammonium sulfate (AESA), polyoxyethylene nonylphenyl ether (TX-10), and a mixture of at least two of LAS, AES, AESA, and TX-10.

4. The method as claimed in claim 1, wherein a concentration of the surfactant solution is within 0.5 wt % to 3 wt %.

5. The method as claimed in claim 1, wherein in step (f), a periodic range of the sub-wavelength structure is within 200 nm to 500 nm.

6. The method as claimed in claim 1, wherein in step (f), the sub-wavelength structure is arranged in any one of a parabola array, a spherical array, and a cone array.

7. The method as claimed in claim 1, wherein in step (f), the substrate is made of a thermoplastic polymer, and the thermoplastic polymer comprises any one of polyethylene (PE), polypropylene (PP), polystyrene (PS), polymethylmethaclylate (PMMA), polyvinyl chloride (PVC), nylon, polycarbonate (PC), polyurethane (PU), polytetrafluoroethylene (PTFE), cyclo olefin copolymer (COC), and a mixture of at least two of PE, PP, PS, PMMA, PVC, nylon, PC, PU, PTFE, and COC.

8. The method as claimed in claim 1, wherein in step (f), the sub-wavelength structure comprises any one of a light curing agent, polydimethylsiloxane (PDMS), diethylene glycol bis-(allyl carbonate), unsaturated polyester, epoxy, phenolic, and a mixture of at least two of PE, PP, PS, PMMA, PVC, nylon, PC, PU, PTFE, and COC.

9. The method as claimed in claim 1, wherein in step (f), the sub-wavelength structure of the brightness enhancement layer is applied to any one of an organic light-emitting diode (OLED), light-emitting diode (LED), and a solar panel.

10. The method as claimed in claim 1, wherein in step (f), the sub-wavelength structure of the brightness enhancement layer is applied to a flat panel display of any one of a mobile device, an automotive navigation system, and a desktop computer, wherein the mobile device is any one of a smart watch, a virtual reality (VR) device, a smart phone, a tablet PC, and a notebook computer.

\* \* \* \* \*